(12) United States Patent
Kishi

(10) Patent No.: US 8,149,188 B2
(45) Date of Patent: Apr. 3, 2012

(54) EL DISPLAY DEVICE

(75) Inventor: Noritaka Kishi, Uda (JP)

(73) Assignee: Sharp Kabushiki Kaisha, Osaka (JP)

( * ) Notice: Subject to any disclaimer, the term of this patent is extended or adjusted under 35 U.S.C. 154(b) by 743 days.

(21) Appl. No.: 12/226,034

(22) PCT Filed: Feb. 1, 2007

(86) PCT No.: PCT/JP2007/051674
§ 371 (c)(1),
(2), (4) Date: Oct. 6, 2008

(87) PCT Pub. No.: WO2008/004348
PCT Pub. Date: Jan. 10, 2008

(65) Prior Publication Data
US 2009/0167645 A1    Jul. 2, 2009

(30) Foreign Application Priority Data
Jul. 5, 2006    (JP) .................................. 2006-185541

(51) Int. Cl.
*G09G 3/30* (2006.01)
(52) U.S. Cl. ......................................................... 345/76
(58) Field of Classification Search .................... 345/76
See application file for complete search history.

(56) References Cited

U.S. PATENT DOCUMENTS

| | | |
|---|---|---|
| 2002/0140646 A1 | 10/2002 | Sato et al. |
| 2003/0076046 A1* | 4/2003 | Komiya et al. ............ 315/169.3 |
| 2004/0095338 A1 | 5/2004 | Miyazawa |
| 2005/0134544 A1* | 6/2005 | Igarashi et al. ................. 345/98 |
| 2005/0179632 A1* | 8/2005 | Miyachi et al. ................. 345/87 |
| 2005/0242441 A1* | 11/2005 | Thompson et al. ........... 257/758 |
| 2005/0258771 A1 | 11/2005 | Kang et al. |
| 2006/0125109 A1* | 6/2006 | Kirby et al. ................... 257/774 |

FOREIGN PATENT DOCUMENTS

| | | |
|---|---|---|
| JP | 05-297404 | 11/1993 |
| JP | 06-160904 | 6/1994 |
| JP | 2001-100655 | 4/2001 |
| JP | 2002-287663 | 10/2002 |
| JP | 2004-145278 | 5/2004 |
| JP | 2005-331919 | 12/2005 |

\* cited by examiner

*Primary Examiner* — Quan-Zhen Wang
*Assistant Examiner* — David Lee
(74) *Attorney, Agent, or Firm* — Harness, Dickey & Pierce, P.L.C.

(57) ABSTRACT

A power source line 1 and a scanning line 3 are arranged on different wiring layers so as to be orthogonal to each other. In the wiring layer on which the scanning line 3 is arranged, a bypass line 111 is arranged on at least a part of a portion obtained by removing a planar position of the scanning line 3 from a planar position of the power source line 1. Contacts 121 and 122 establish electric connection between the power source line 1 and the bypass line 111. As described above, the bypass line 111 is connected to the power source line 1 in parallel, leading to decrease in resistance of the power source line 1 and suppression of unevenness in brightness at a display screen. Moreover, an additional manufacturing step for providing the bypass line 111 is unnecessary. Further, an aperture ratio is not reduced even when the bypass line 111 is provided. When the bypass line 111 is made wider than the power source line 1, a pixel circuit can be prevented from operating erroneously due to external light.

10 Claims, 11 Drawing Sheets

EL DISPLAY DEVICE

TECHNICAL FIELD

The present invention relates to an electroluminescence display device. In particular, the present invention relates to an active matrix-type electroluminescence display device in which pixel circuits each including an electroluminescence element and a thin-film transistor(s) are arranged two-dimensionally.

BACKGROUND ART

As a self-luminous display device, recently, attention has been given to an electroluminescence (EL) display device using an EL element. In addition, there has also been developed an active matrix-type EL display device in which pixel circuits each including an EL element and a thin-film transistor (TFT) are arranged two-dimensionally.

An organic EL element, which is one example of EL elements, has a sandwich structure in which a light emitting layer made of an organic substance is interposed between an anode and a cathode. In the organic EL element, when a voltage is applied between the anode and the cathode, holes are injected from the anode into the light emitting layer while electrons are injected from the cathode into the light emitting layer. The hole and the electron each injected are recombined with each other in the light emitting layer to generate an exciton, and the generated exciton emits light upon annihilation. Thus, the organic EL element emits light.

In an active matrix-type EL display device, an EL element emits light at a brightness according to a drive current supplied from a drive TFT in a pixel circuit that includes the EL element. One of two electrodes between which a light emitting layer is interposed is made of a transparent material; therefore, the light emitted from the light emitting layer transmits through the transparent electrode and, then, goes out of the EL display device. Thus, the active matrix-type EL display device performs surface light emission to display a screen.

In the active matrix-type EL display device, an electric current must be supplied to the pixel circuit through a power source line in order to allow the EL element to emit light. For example, a pixel circuit (a typical pixel circuit having a configuration called 2 TFT+1 C) shown in FIG. 2 performs a constant current drive operation of supplying a signal potential at a data line 2 to a gate terminal of a second TFT 32 (which functions as a drive TFT) through a first TFT 31 (which functions as a switch) and, then, supplying an electric current according to a conductance of the second TFT 32 to an EL element 10. In general, however, when an electric current flows through a line having a resistive component, a voltage drop occurs. In the active matrix-type EL display device, consequently, there is a difference in power source voltage to be supplied between a pixel circuit arranged at an end portion and a pixel circuit arranged at a center portion, so that unevenness in brightness occurs at a display screen in some instances.

Specifically, an electric current Id which flows through a drive TFT is given by the following expression (1) in consideration of a channel length modulation effect.

$$Id=(1/2)\mu Cox(W/L)(Vgs-Vth)^2(1-\lambda Vds) \quad (1)$$

In the expression (1), $\mu$ represents a mobility, Cox represents a capacity of a gate oxide film, W/L represents an aspect ratio, Vgs represents a gate-to-source voltage, Vth represents a threshold voltage, $\lambda$ represents a channel length modulation coefficient, and Vds represents a drain-to-source voltage.

A source potential varies by a voltage drop occurring at a power source line, so that the gate-to-source voltage Vgs and the drain-to-source voltage Vds change. As shown in the expression (1), then, the electric current Id supplied from the drive TFT to the EL element changes, so that the brightness of the EL element also changes. Consequently, the unevenness in brightness occurs at the display screen.

In order to prevent the unevenness in brightness, preferably, a resistance of the power source line is decreased and a potential at the power source line is made constant. The low resistance of the power source line allows not only prevention of the unevenness in brightness, but also reduction in Joule heat generated at the power source line and reduction in electric power consumed by the power source line.

As a method of decreasing the resistance of the power source line, there have been considered a method of making a width of a power source line wide and a method of making a thickness of a wiring layer large. As shown in FIG. 11, moreover, Patent document 1 discloses a method of providing power source lines VL arranged in parallel with data lines DL and, additionally, bypass power source lines BL arranged in parallel with scanning lines GL and establishing electric connection between the power source line VL and the bypass power source line BL through a contact C1, thereby providing the power source lines in a lattice shape. As shown in FIG. 12, Patent document 2 discloses a method of establishing electric connection between a power source line VL and a light shielding film BM (a portion surrounded by a bold line) through a contact C2, thereby connecting the light shielding film to the power source line in parallel.

Patent document 1: JP 2001-100654 A
Patent document 2: JP 2001-100655 A

DISCLOSURE OF THE INVENTION

Problems to be Solved by the Invention

However, the methods described above have the following problems. In a bottom emission-type EL display device which has been used frequently in general, a power source line is provided at a transparent electrode side with respect to a light emitting layer. For this reason, if a width of the power source line is made wide, an aperture ratio becomes small, resulting in deterioration of light extraction efficiency. Moreover, if a thickness of a wiring layer is made large, a process becomes complicated and a design margin must be made large (e.g., a minimum wiring width must be made wide) resulting in increase in cost and reduction in aperture ratio. The method disclosed in Patent document 1 also causes reduction in aperture ratio. Further, the method disclosed in Patent document 2 requires an additional step of providing the contact for establishing electric connection between the power source line and the light shielding film and, consequently, causes increase in cost.

An EL display device has problems to be solved, in addition to unevenness in brightness. A signal line also has a resistive component and a capacitive component, which is similar to a power source line. Therefore, the signal line provided between an external terminal and a pixel circuit can be regarded as a distributed RC circuit including a resistive component and a stray capacitor formed between different layers or adjoining conductors. Consequently, if a frequency of a signal flowing through the signal line increases, this distributed RC circuit degrades a frequency characteristic of the signal. Moreover, the EL display device includes a light shielding film for shielding light emitted from a light emitting layer. However, there is a possibility that a TFT operates erroneously due to external light. The methods described above can not solve these problems.

Therefore, an object of the present invention is to provide an EL display device that decreases a resistance of a power source line without incurring increase in cost and reduction in aperture ratio and suppresses unevenness in brightness at a display screen.

Means For Solving The Problems

According to a first aspect of the present invention, an active matrix-type EL display device includes: a plurality of power source lines arranged in parallel with one another on a predetermined wiring layer; a plurality of signal lines arranged in parallel with one another on a wiring layer, which is different from the wiring layer on which the power source lines are arranged, so as to be orthogonal to the power source lines; a plurality of pixel circuits each including an EL element and one or more thin-film transistors, the plurality of pixel circuits being arranged side by side in an extending direction of the power source line and an extending direction of the signal line; a bypass line arranged on at least a part of a portion obtained by removing a planar position of the signal line from a planar position of the power source line in the wiring layer on which the signal lines are also arranged; and a contact establishing electric connection between the power source line and the bypass line.

According to a second aspect of the present invention, in the first aspect of the present invention, the signal line is a scanning line.

According to a third aspect of the present invention, in the first aspect of the present invention, the bypass line is electrically connected to the power source line through two contacts provided at two ends thereof.

According to a fourth aspect of the present invention, in the first aspect of the present invention, the bypass line is electrically connected to the power source line through one contact which is almost equal in length thereto.

According to a fifth aspect of the present invention, in the first aspect of the present invention, the bypass line is electrically connected to the power source line through a plurality of contacts provided on an almost entire part thereof.

According to a sixth aspect of the present invention, in the first aspect of the present invention, the bypass line has a width which is almost equal to a width of the power source line.

According to a seventh aspect of the present invention, in the first aspect of the present invention, the bypass line has a width of which at least a part is wider than a width of the power source line.

According to an eighth aspect of the present invention, in the first aspect of the present invention, the EL display device further includes: a signal bypass line arranged on at least a part of a portion obtained by removing the planar position of the power source line from the planar position of the signal line in the wiring layer on which the power source lines are also arranged; and a signal contact establishing electric connection between the signal line and the signal bypass line.

According to a ninth aspect of the present invention, in the first aspect of the present invention, the pixel circuit includes the EL element, and a drive thin-film transistor provided between the EL element and the power source line to control an amount of electric current to be fed into the EL element.

According to a tenth aspect of the present invention, in the ninth aspect of the present invention, the pixel circuit further includes a control thin-film transistor provided between the drive thin-film transistor and the power source line to determine whether or not the electric current is fed into the EL element.

EFFECTS OF THE INVENTION

According to the first aspect of the present invention, the bypass line electrically connected to the power source line is arranged at the planar position of the power source line in the wiring layer, on which the signal line is also arranged, so as not to intersect the signal line. By providing such a bypass line, a resistance of the power source line can be decreased. Thus, power source voltages to be supplied to the pixel circuits become equal to one another, leading to suppression of unevenness in brightness at a display screen. Moreover, the bypass line is arranged at the planar position of the power source line in the wiring layer on which the signal line is also arranged; therefore, an additional manufacturing step for providing the bypass line is unnecessary. Further, an aperture ratio is not reduced even when the bypass line is provided. Accordingly, it is possible to decrease the resistance of the power source line without incurring increase in cost and reduction in aperture ratio and to suppress the unevenness in brightness at the display screen.

According to the second aspect of the present invention, in the EL display device in which the power source line and the scanning line are arranged so as to be orthogonal to each other, it is possible to decrease the resistance of the power source line without incurring increase in cost and reduction in aperture ratio and to suppress the unevenness in brightness at the display screen.

According to the third aspect of the present invention, the two contacts are provided at the two ends of the bypass line; therefore, the power source line and the bypass line can be electrically connected to each other with ease.

According to the fourth aspect of the present invention, by providing the single contact which is almost equal in length to the bypass line, a contact resistance can be decreased and the resistance at the portion where the power source line and the bypass line are connected in parallel can be further decreased.

According to the fifth aspect of the present invention, by providing the plurality of contacts on the almost entire part of the bypass line, the contact resistance can be decreased and the resistance at the portion where the power source line and the bypass line are connected in parallel can be further decreased. In addition, by providing the plurality of contacts each having a small size, surface roughness on the contact can be made small as compared with a case where only one contact having a large size is provided.

According to the sixth aspect of the present invention, the width of the bypass line is set to be almost equal to that of the power source line, so that the pixel circuit can be designed with ease.

According to the seventh aspect of the present invention, the width of the bypass line is made wider than that of the power source line, so that the resistance at the portion where the power source line and the bypass line are connected in parallel can be further decreased, and light shielding can be achieved by the bypass line. Thus, it is possible to prevent the pixel circuit from operating erroneously due to external light, for example.

According to the eighth aspect of the present invention, the signal bypass line electrically connected to the signal line is arranged at the planar position of the signal line in the wiring layer, on which the power source line is also arranged, so as not to intersect the power source line. By providing such a signal bypass line, a resistance of the signal line can be decreased. Thus, it is possible to reduce a time constant of a distributed RC circuit formed by the signal line, to prevent delay of a signal flowing through the signal line and to suppress degradation of the signal flowing through the signal line. Moreover, since the signal bypass line is arranged at the planar position of the signal line in the wiring layer on which the power source line is also provided, an additional manufacturing step for providing the signal bypass line is unnecessary. Further, an aperture ratio is not reduced even when the signal bypass line is provided. Accordingly, it is possible to decrease the resistance of the signal line without incurring increase in cost and reduction in aperture ratio, to enhance display quality, and to allow the pixel circuit to operate at high speed.

According to the ninth aspect of the present invention, in the EL display device that includes the pixel circuit including the EL element and the drive thin-film transistor, it is possible to decrease the resistance of the power source line without incurring increase in cost and reduction in aperture ratio and to suppress the unevenness in brightness at the display screen.

According to the tenth aspect of the present invention, in the EL display device that includes the pixel circuit including the EL element, the drive thin-film transistor and the control thin-film transistor, it is possible to decrease the resistance of the power source line without incurring increase in cost and reduction in aperture ratio and to suppress the unevenness in brightness at the display screen.

DESCRIPTION OF REFERENCE NUMERALS

1: Power source line
2: Data line
3: Scanning line
4 Control line
10 EL element
21 Capacitor
31, 32, 33: TFT
41: Transparent electrode
100, 200, 300, 400, 500, 600: Pixel
111, 411, 511: Bypass line
51, 121, 122, 221, 321, 521, 522: Contact

BEST MODE FOR CARRYING OUT THE INVENTION

First Embodiment

Figure 1:
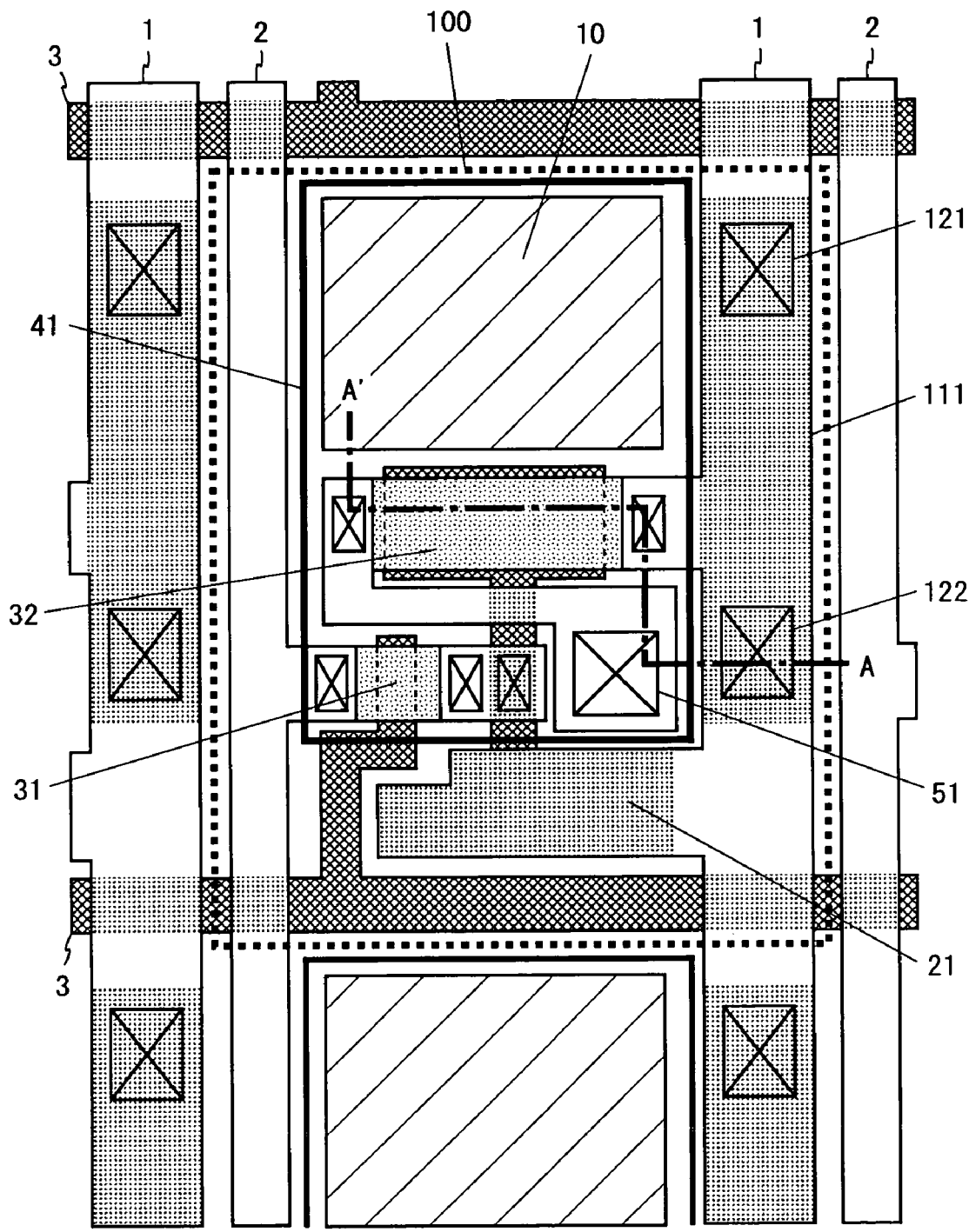
FIG. 1 is a plan view of a pixel in an EL display device according to a first embodiment of the present invention.

FIG. 1 is a plan view of a pixel in an EL display device according to a first embodiment of the present invention. A layout of pixels included in the EL display device according to this embodiment is shown in FIG. 1. A pixel 100 (a portion surrounded by a bold broken line) shown in FIG. 1 functions as one pixel in an EL display device that performs monochromatic display, and functions as a sub pixel corresponding to one color in an EL display device that performs color display. The EL display device according to this embodiment is an active matrix-type EL display device having a plurality of pixels 100 arranged two-dimensionally.

As shown in FIG. 1, the EL display device according to this embodiment includes a plurality of power source lines 1, a plurality of data lines 2 and a plurality of scanning lines 3. These lines are arranged on one of two wiring layers: upper and lower wiring layers. Of the upper and lower wiring layers, hereinafter, the lower wiring layer (a wiring layer which is close to a substrate) is referred to as a first wiring layer while the upper wiring layer (a wiring layer which is far from the substrate) is referred to as a second wiring layer.

The power source lines 1 are arranged in parallel with one another on the second wiring layer. The data lines 2 are arranged together with the power source lines 1 in parallel with one another on the second wiring layer. An extending direction of each of the power source line 1 and the data line 2 corresponds to a vertical direction in FIG. 1. The scanning lines 3 are arranged in parallel with one another on the first wiring layer. An extending direction of the scanning line 3 corresponds to a horizontal direction in FIG. 1. As described above, the scanning lines 3 are arranged in parallel with one another on the wiring layer different from the wiring layer on which the power source lines 1 are arranged, so as to be orthogonal to the power source lines 1.

In the plan views of the pixels shown in FIG. 1 and the following, the line on the first wiring layer is shown with a crosshatch pattern while the line on the second wiring layer is shown without any pattern. Herein, at an overlap portion of the line on the first wiring layer and the line on the second wiring layer, a part of the crosshatch pattern is shown in a see-through manner. Moreover, a rectangular region shown with a dot pattern denotes an active layer while a rectangle shown with diagonal lines denotes a contact. A contact drawn on the overlap portion of the line on the first wiring layer and the line on the second wiring layer establishes electric connection between the first wiring layer and the second wiring layer, and a contact other than that establishes electric connection between the active layer and the second wiring layer, except a contact 51 which will be described later.

In addition to the power source line 1, the data line 2 and the scanning line 3, the pixel 100 is provided with a pixel circuit including an EL element 10, a capacitor 21, a first TFT 31, a second TFT 32 and a transparent electrode 41. Herein, the EL element 10 functions as a light emitting element. The capacitor 21 is formed at the overlap portion of the line on the first wiring layer and the line on the second wiring layer. The first and second TFTs 31 and 32 are formed in such a manner that an active layer (a dot pattern portion) is superimposed on the line on the first wiring layer and contacts are provided at two ends of the active layer so as to establish electric connection between the active layer and the second wiring layer. The transparent electrode 41 is electrically connected to the line on the second wiring layer through the contact 51, and functions as an anode of the EL element 10. A plurality of pixel circuits each configured as described above are arranged side by side in a two-dimensional form (specifically, in the extending direction of the power source line 1 and the extending direction of the scanning line 3).

Figure 2:
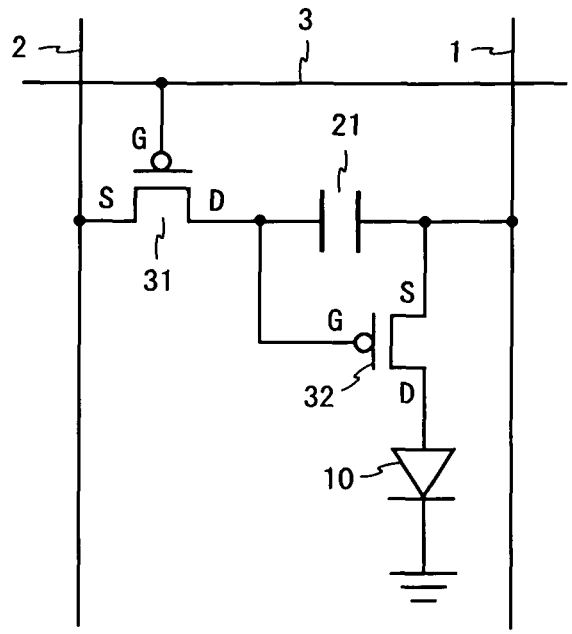
FIG. 2 is a circuit diagram of an equivalent circuit of the pixel shown in FIG. 1.

FIG. 2 is a circuit diagram of an equivalent circuit of the pixel 100. In the pixel 100, the second TFT 32 and the EL element 10 are provided in serial on a path connecting between the power source line 1 and a ground. Moreover, the capacitor 21 and the first TFT 31 are provided in serial between the power source line 1 and the data line 2. Each of the first and second TFTs 31 and 32 is of a P-channel type. The first TFT 31 has a gate terminal connected to the scanning line 3, and the second TFT 32 has a gate terminal connected to a drain terminal of the first TFT 31. The second TFT 32 functions as a drive TFT that controls an amount of electric current to be fed into the EL element 10.

In order to allow the pixel 100 to emit light at a brightness according to image data, a low-level potential is given to the scanning line 3 and a potential according to the image data (hereinafter, referred to as a potential Vx) is given to the data line 2. Herein, the first TFT 31 is brought into a conductive state and a potential at the gate terminal of the second TFT 32 becomes equal to the potential Vx. Thereafter, when the potential at the scanning line 3 is changed to a high-level potential, the first TFT 31 is brought into a non-conductive state and the potential at the gate terminal of the second TFT 32 is fixed at the potential Vx by action of the capacitor 21. An amount of drive current to be supplied from the second TFT 32 to the EL element 10 varies in accordance with the potential at the gate terminal of the second TFT 32, the EL element 10 emits light at a brightness according to the drive current supplied from the second TFT 32. Thus, the EL element 10 emits light at the brightness according to the potential Vx.

In addition to the power source line 1, the data line 2, the scanning line 3 and the pixel circuit, the EL display device according to this embodiment also includes a bypass line 111, and contacts 121 and 122. The bypass line 111 has a width which is equal to that of the power source line 1, and is arranged on at least a part of a portion obtained by removing a planar position of the scanning line 3 from a planar position of the power source line 1 in the first wiring layer (the wiring layer on which the scanning line 3 is also arranged). The contacts 121 and 122 are provided at two ends of the bypass line 111 to establish electric connection between the power source line 1 and the bypass line 111. As described above, the bypass line 111 is electrically connected to the power source line 1 through the two contacts 121 and 122 provided at the two ends thereof, and functions as a bypass line connected to the power source line 1 in parallel.

The bypass line 111 is connected to the power source line 1 in parallel as described above, so that a resistance of the power source line 1 can be decreased. Specifically, when a sheet resistance of the power source line 1 is represented by ρ1 and a sheet resistance of the bypass line 111 is represented by ρ2, a resistance of a portion where the power source line 1 and the bypass line 111 are connected in parallel is given by an expression of (ρ1×ρ2)/(ρ1+ρ2).

In FIG. 1, the bypass line 111 is arranged in about two-thirds of the portion obtained by removing the planar position of the scanning line 3 from the planar position of the power source line 1 (i.e., the position obtained by removing a portion where the power source line 1 and the scanning line 3 intersect each other from the planar position of the power source line 1). However, the bypass line 111 may be longer or shorter in length than this case. Moreover, the width of the bypass line 111 may be wider or narrower than the width of the power source line 1 as long as it exerts no adverse influence on the layout of the pixel circuit. In a case where the power source line 1 also intersects a signal line (hereinafter, referred to as a signal line S) other than the scanning line 3, the bypass line 111 is arranged on a portion obtained by removing the planar position of the scanning line 3 and the signal line S from the planar position of the power source line 1 (i.e., a position obtained by removing the portion where the power source line 1 and the scanning line 3 intersect each other and the portion where the power source line 1 and the signal line S intersect each other from the planar position of the power source line 1).

Figure 3:
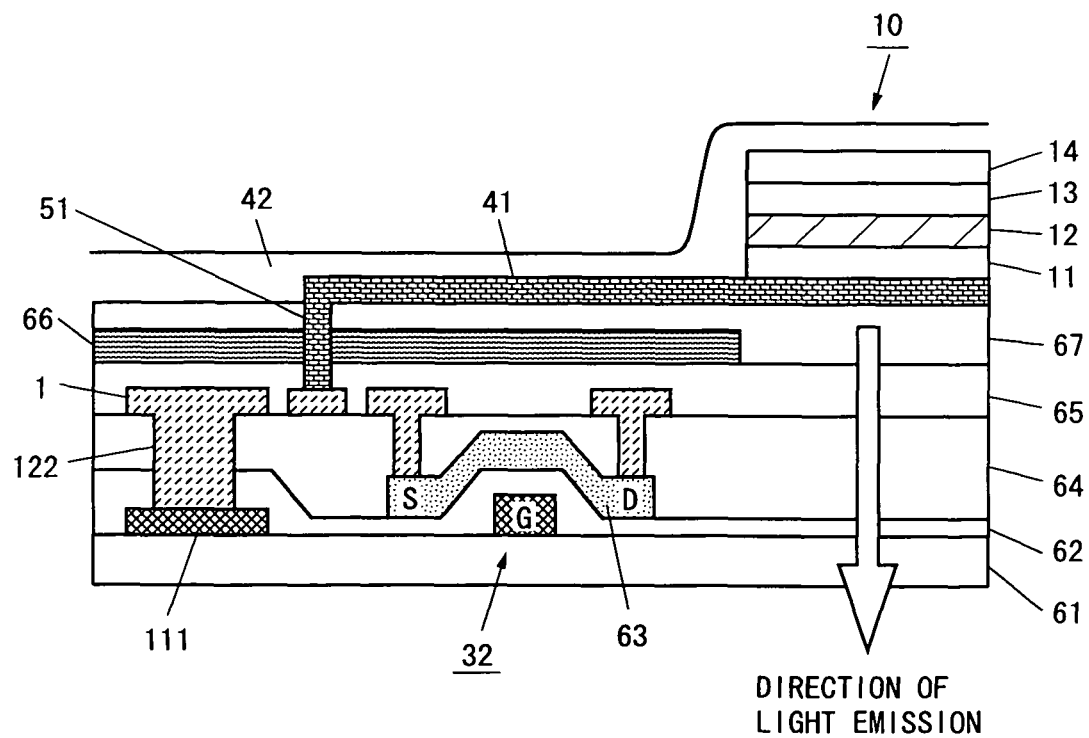
FIG. 3 is a sectional view taken along a line A-A' in FIG. 1.

With reference to FIG. 3, hereinafter, description will be given of manufacturing steps for the EL display device according to this embodiment. FIG. 3 is a sectional view taken along a line A-A' in FIG. 1. In FIG. 3, a left side corresponds to a side A in FIG. 1. As shown in FIG. 3, the EL display device according to this embodiment is a bottom emission-type EL display device that emits light from a back side of a substrate. In addition, the TFT included in the EL display device is a bottom gate-type transistor having a gate electrode provided on a bottom side of the substrate.

In FIG. 3, a transparent substrate 61 is a transparent substrate of which at least a surface has an insulating property. Examples of a material for the transparent substrate 61 include glass, synthetic resin, and the like. The first wiring layer, a gate insulating film 62, an active layer 63, an interlayer insulating film 64 and the second wiring layer are provided in this order on the transparent substrate 61. Thus, the pixel 100 is formed.

First, the first wiring layer is provided on the transparent substrate 61. As shown in FIG. 1, thus, the scanning line 3, a lower electrode of the capacitor 21, a gate electrode of the first TFT 31, a gate electrode of the second TFT 32, and the bypass line 111 are formed. Moreover, electric connection is established between the scanning line 3 and the gate electrode of the first TFT 31, and between the lower electrode of the capacitor 21 and the gate electrode of the second TFT 32. Since the upper layer is made of polycrystalline silicon or amorphous silicon, the first wiring layer is made of high melting point metal such as chromium or thallium.

Next, the gate insulating film 62 and the active layer 63 are stacked on the entire surface of the substrate. Each of the gate insulating film 62 and the active layer 63 has a thickness of about several tens of nanometers. Next, the active layer 63 is subjected to selective etching through use of a photomask, so that channels of the first and second TFTs 31 and 32 are formed.

Next, the interlayer insulating film 64 is stacked on the entire surface of the substrate. Next, through holes each penetrating through the gate insulating film 62 and the interlayer insulating film 64 are formed at positions where contacts for establishing electric connection between the first wiring layer and the second wiring layer are provided and positions where contacts for establishing electric connection between the active layer 63 and the second wiring layer are provided, respectively.

Next, the second wiring layer is provided on the substrate and, in conjunction therewith, the through holes are filled with a metal material which is equal to the material for the second wiring layer. As shown in FIG. 1, thus, the power source line 1, the data line 2, the upper electrode of the capacitor 21, the contacts for establishing the electric connection between the first wiring layer and the second wiring layer (including the contacts 121 and 122), the contacts for establishing the electric connection between the active layer 63 and the second wiring layer, and an arrangement region of the contact 51 are formed. Moreover, electric connection is established between the power source line 1 and the upper electrode of the capacitor 21, between the power source line 1 and a source terminal of the second TFT 32, between a drain terminal of the second TFT 32 and the arrangement region of the contact 51, between the data line 2 and a source terminal of the first TFT 31, between the drain terminal of the first TFT 31 and the gate terminal of the second TFT 32, and between the power source line 1 and the bypass line 111, respectively.

Next, a passivation film 65, a light shielding film 66 and a flattening film 67 are provided on the substrate. The passivation film 65 has a thickness of about 0.3 μm, the light shielding film 66 has a thickness of about 1.5 μm, and the flattening film 67 has a thickness of about 3.5 μm. In particular, the light shielding film 66 is provided so as to cover the first and second TFTs 31 and 32.

Next, a through hole penetrating through the passivation film 65, the light shielding film 66 and the flattening film 67 is formed at a position where the contact 51 is provided. Next, the transparent electrode 41 is provided on the substrate and, in conjunction therewith, the through hole is filled with a material which is equal to the material for the transparent electrode 41; thus, the contact 51 is formed. Examples of the material for the transparent electrode 41 include ITO (Indium Tin Oxide), and the like.

Next, a hole transporting layer 11, a light emitting layer 12, an electron transporting layer 13 and an electron injecting layer 14 are provided on the transparent electrode 41. Next, a back electrode 42 made of a metal material is provided on the entire surface of the substrate. The back electrode 42 functions as a cathode of the EL element 10. Finally, the substrate is sealed for protecting the EL element 10 from moisture. Through the steps described above, the EL display device according to this embodiment can be manufactured.

In the EL display device according to this embodiment, as described above, the bypass line 111 electrically connected to the power source line 1 is arranged at the planar position of the power source line 1 in the wiring layer, on which the scanning line 3 is also arranged, so as not to intersect the scanning line 3. By providing such a bypass line 111, the resistance of the power source line 1 can be decreased. Thus, power source voltages to be supplied to the pixel circuits become equal to one another, leading to suppression of unevenness in brightness at a display screen.

Moreover, the bypass line 111 is arranged at the planar position of the power source line 1 in the wiring layer on which the scanning line 3 is also arranged; therefore, an additional manufacturing step for providing the bypass line 111 is unnecessary. Further, an aperture ratio is not reduced even when the bypass line 111 is provided. Accordingly, the EL display device according to this embodiment can decrease the resistance of the power source line 1 without incurring increase in cost and reduction in aperture ratio and suppress the unevenness in brightness at the display screen.

In the EL display device according to this embodiment, moreover, the two contacts are provided at the two ends of the bypass line 111; therefore, the power source line 1 and the bypass line 111 can be electrically connected to each other with ease. In addition, since the width of the bypass line 111 is equal to that of the power source line 1, the pixel circuit can be designed with ease.

Second to Sixth Embodiments

EL display devices according to second to sixth embodiments are almost equal in configuration to the EL display device according to the first embodiment. In the following, therefore, constituent elements identical with those in the first embodiment are denoted by the identical reference symbols and description thereof will not be given, and description will be given of differences between the second to sixth embodiments and the first embodiment.

Figure 4:
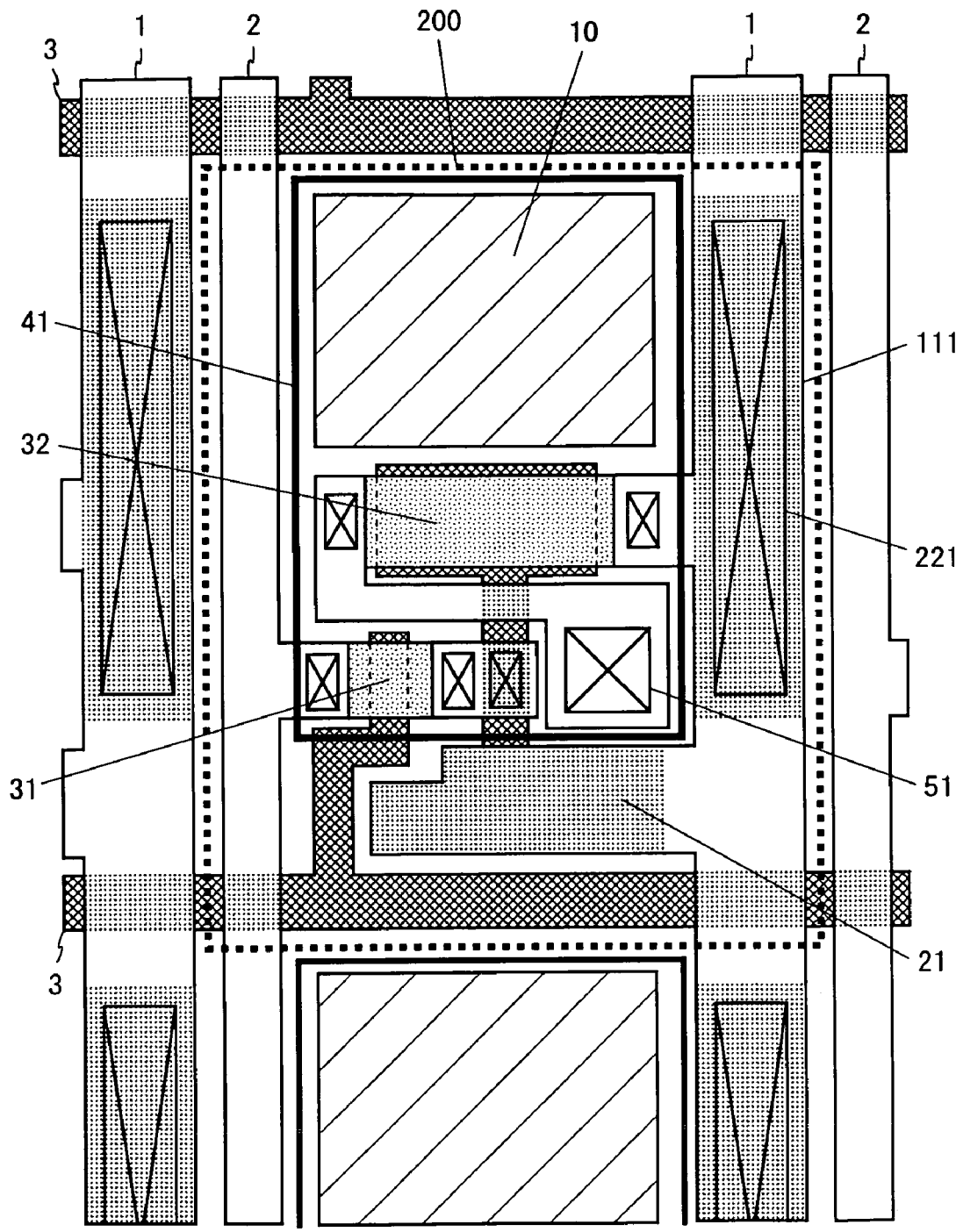
FIG. 4 is a plan view of a pixel in an EL display device according to a second embodiment of the present invention.

FIG. 4 is a plan view of a pixel in the EL display device according to the second embodiment of the present invention. A pixel 200 shown in FIG. 4 includes one contact 221 which is almost equal in length to the bypass line 111, in place of the two contacts 121 and 122. The contact 221 can be formed by a method which is equal to that for the contacts 121 and 122.

In the EL display device according to the second embodiment, as described above, by providing the single contact 221 which is almost equal in length to the bypass line 111, a contact resistance can be decreased and the resistance at the portion where the power source line 1 and the bypass line 111 are connected in parallel can be further decreased.

Figure 5:
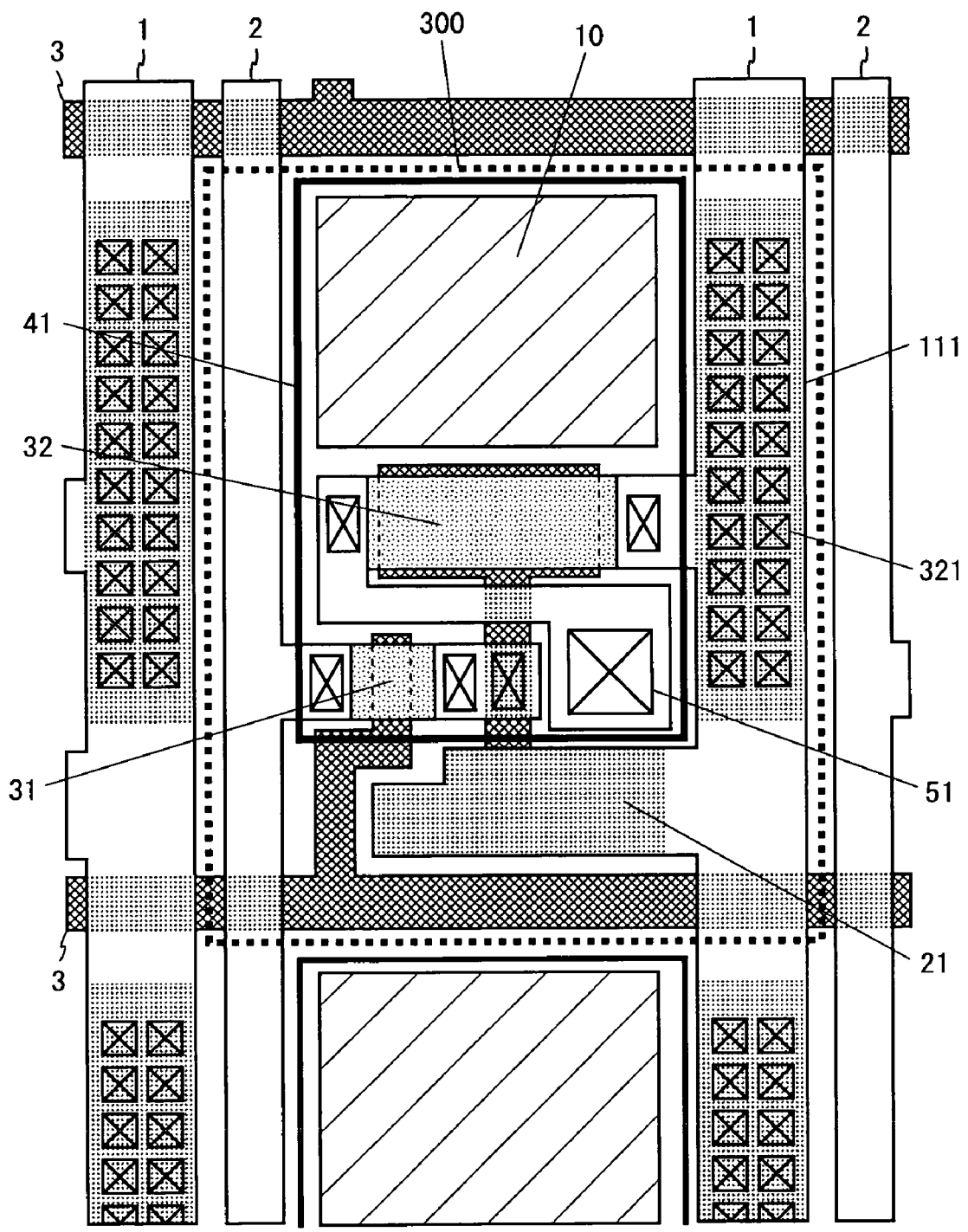
FIG. 5 is a plan view of a pixel in an EL display device according to a third embodiment of the present invention.

FIG. 5 is a plan view of a pixel in the EL display device according to the third embodiment of the present invention. A pixel 300 shown in FIG. 5 includes a plurality of contacts 321 provided on an almost entire part of the bypass line 111, in place of the two contacts 121 and 122. The contact 321 can be formed by a method which is equal to that for the contacts 121 and 122.

In the EL display device according to the third embodiment, as described above, by providing the plurality of contacts 321 on the almost entire part of the bypass line 111, a contact resistance can be decreased and the resistance at the portion where the power source line 1 and the bypass line 111 are connected in parallel can be further decreased. In addition, by providing the plurality of contacts 321 each having a small size, surface roughness on the contact can be made small as compared with a case where only one contact having a large size is provided.

Figure 6:
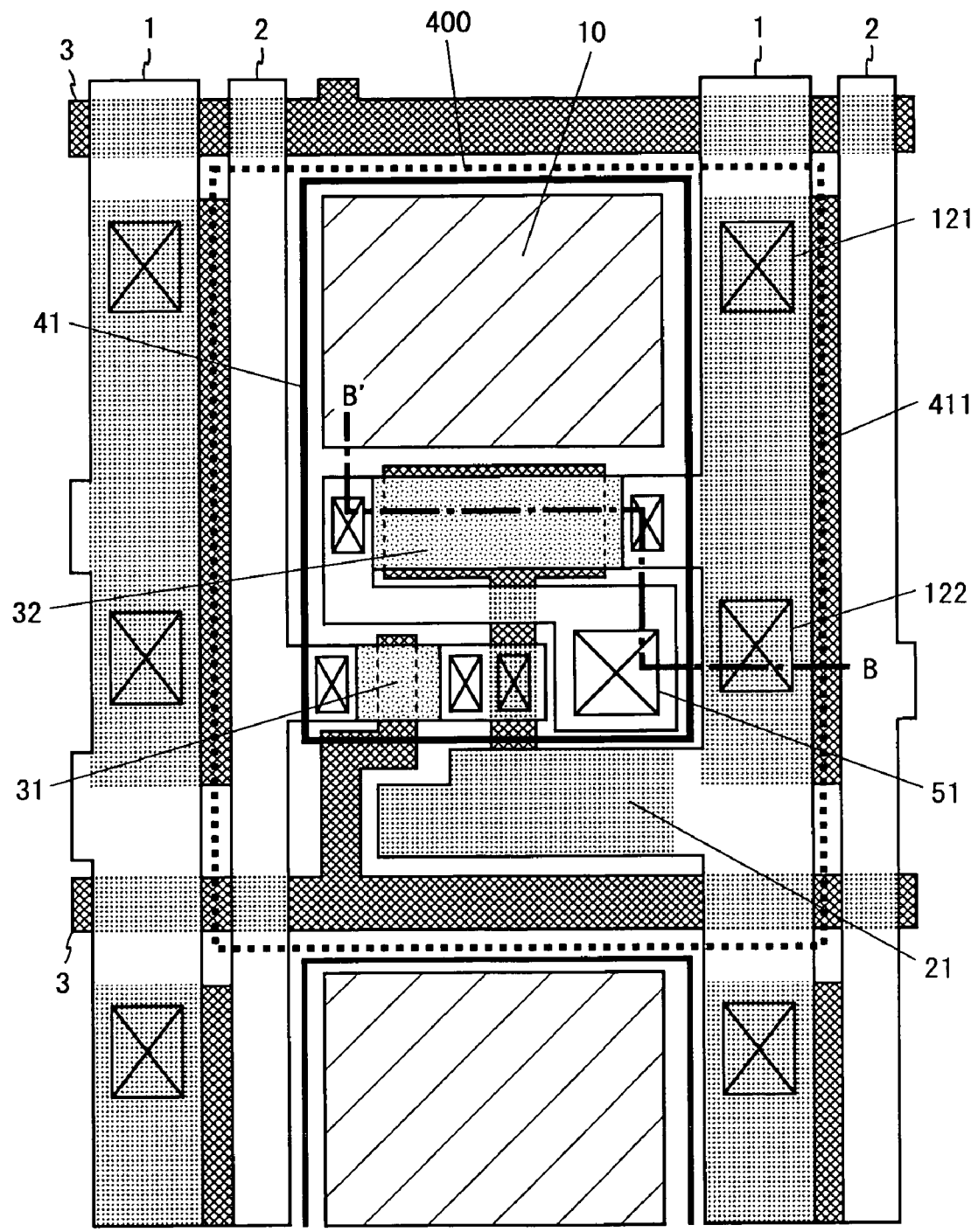
FIG. 6 is a plan view of a pixel in an EL display device according to a fourth embodiment of the present invention.

FIG. 6 is a plan view of a pixel in the EL display device according to the fourth embodiment of the present invention. A pixel 400 shown in FIG. 6 includes a bypass line 411 which is wider in width than the power source line 1, in place of the bypass line 111 which is equal in width to the power source line 1. The bypass line 411 can be formed by a method which is equal to that for the bypass line 111.

Figure 7:
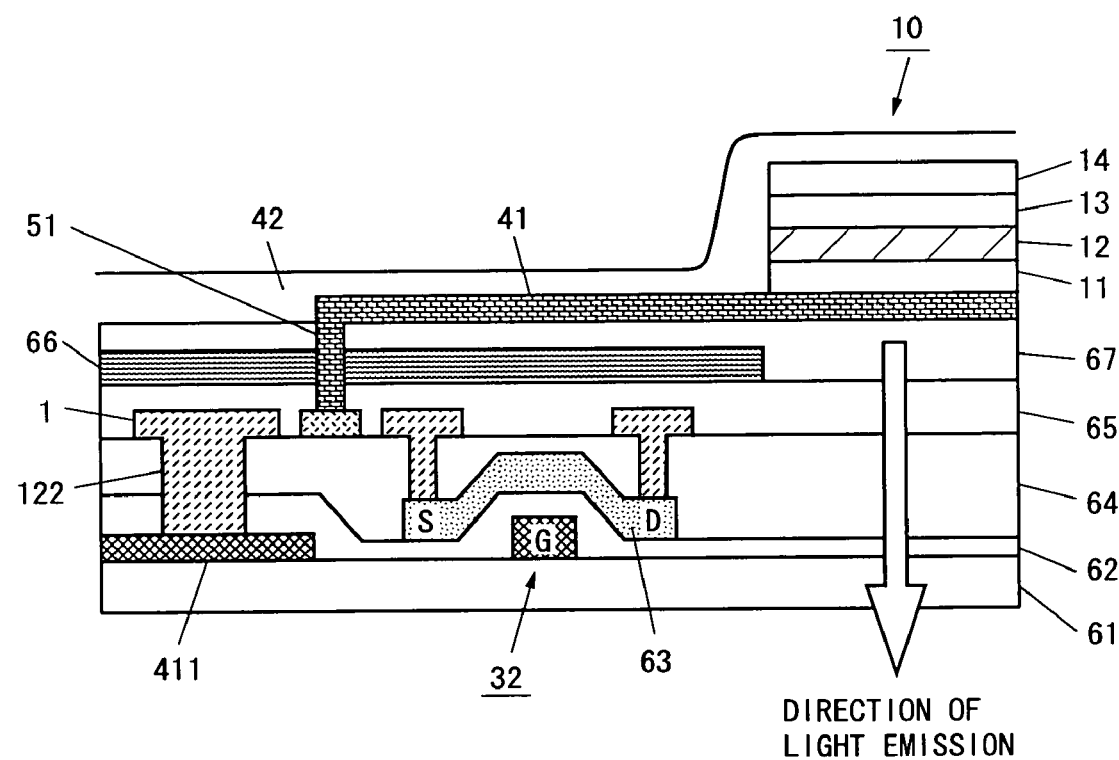
FIG. 7 is a sectional view taken along a line B-B' in FIG. 6.

FIG. 7 is a sectional view taken along a line B-B' in FIG. 6. In FIG. 7, a left side corresponds to a side B in FIG. 6. The bypass line 411 is provided on the first wiring layer, which is similar to the bypass line 111. When the width of the bypass line 411 is made wide, an amount of light, which transmits through the transparent substrate 61 to enter the EL display device, is reduced. Accordingly, it is possible to prevent a possibility that the TFT operates erroneously due to external light.

In the EL display device according to the fourth embodiment, as described above, the width of the bypass line 411 is made wider than that of the power source line 1, so that a resistance at a portion where the power source line 1 and the bypass line 411 are connected in parallel can be further decreased, and light shielding can be achieved by the bypass line 411. Thus, it is possible to prevent the pixel circuit from operating erroneously due to the external light, for example.

Figure 8:
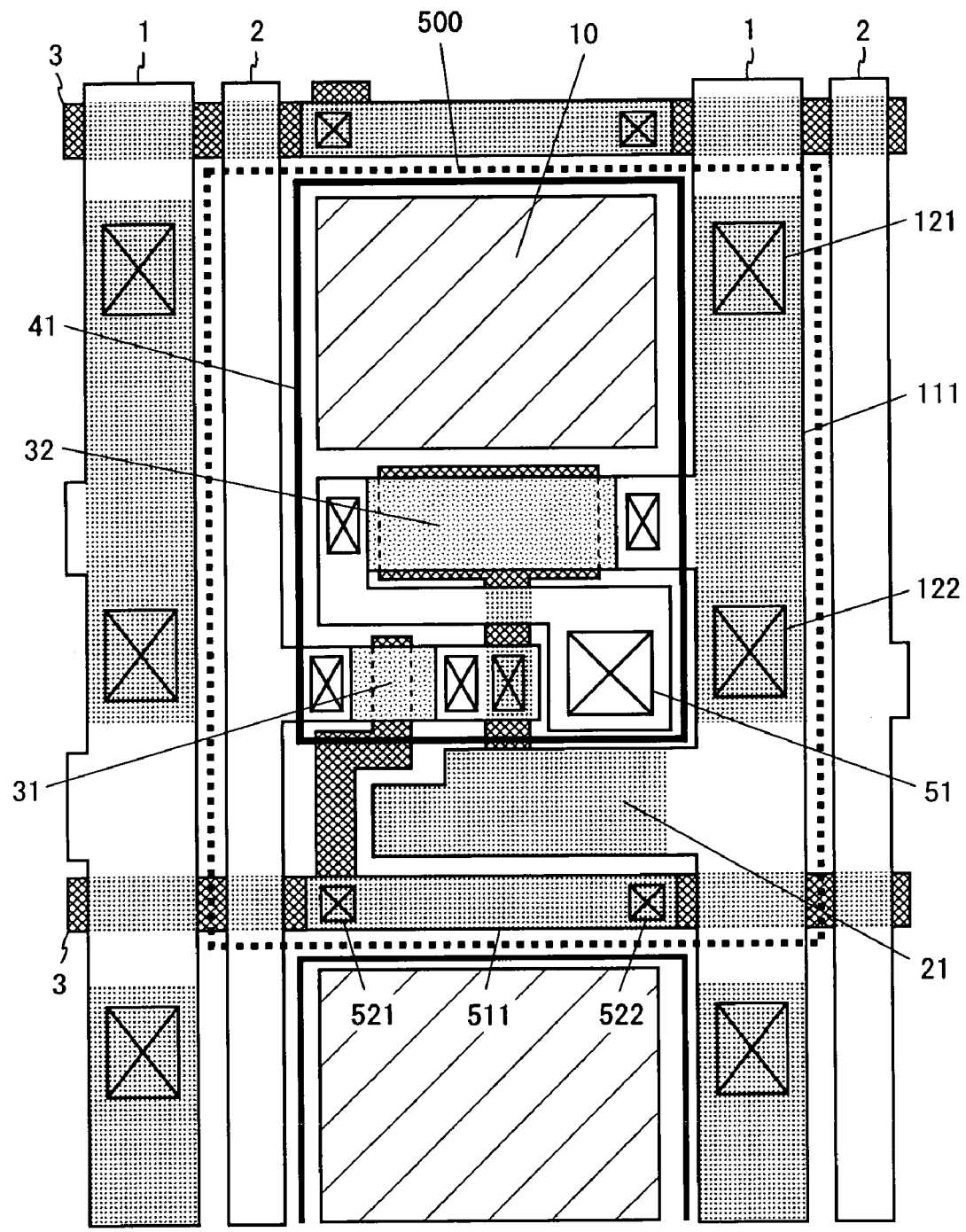
FIG. 8 is a plan view of a pixel in an EL display device according to a fifth embodiment of the present invention.

FIG. 8 is a plan view of a pixel in the EL display device according to the fifth embodiment of the present invention. A pixel 500 shown in FIG. 8 newly includes a bypass line 511, and contacts 521 and 522, in addition to the constituent elements of the pixel 100. The bypass line 511 is arranged on at least a part of the portion obtained by removing the planar position of the power source line 1 and the data line 2 from the planar position of the scanning line 3 in the second wiring layer (the wiring layer on which the power source line 1 is also arranged). The contacts 521 and 522 are provided at two ends of the bypass line 511 to establish electric connection between the scanning line 3 and the bypass line 511. The bypass line 511 and the contacts 521 and 522 can be formed by methods which are equal to those for the other lines and contacts.

In the EL display device according to the fifth embodiment, as described above, the bypass line 511 electrically connected to the scanning line 3 is arranged at the planar position of the scanning line 3 in the wiring layer, on which the power source line 1 is also arranged, so as not to intersect the power source line 1 and the data line 2. By providing such a bypass line 511, the resistance of the scanning line 3 can be decreased. Thus, it is possible to reduce a time constant of a distributed RC circuit formed by the scanning line 3, to prevent delay of a signal flowing through the scanning line 3 and to suppress degradation of the signal flowing through the scanning line 3.

Moreover, since the bypass line 511 is arranged at the planar position of the scanning line 3 in the wiring layer on which the power source line 1 is also provided, an additional manufacturing step for providing the bypass line 511 is unnecessary. Further, an aperture ratio is not reduced even when the bypass line 511 is provided. Accordingly, it is possible to decrease the resistance of the scanning line 3 without incurring increase in cost and reduction in aperture ratio, to enhance display quality, and to allow the pixel circuit to operate at high speed.

Figure 9:
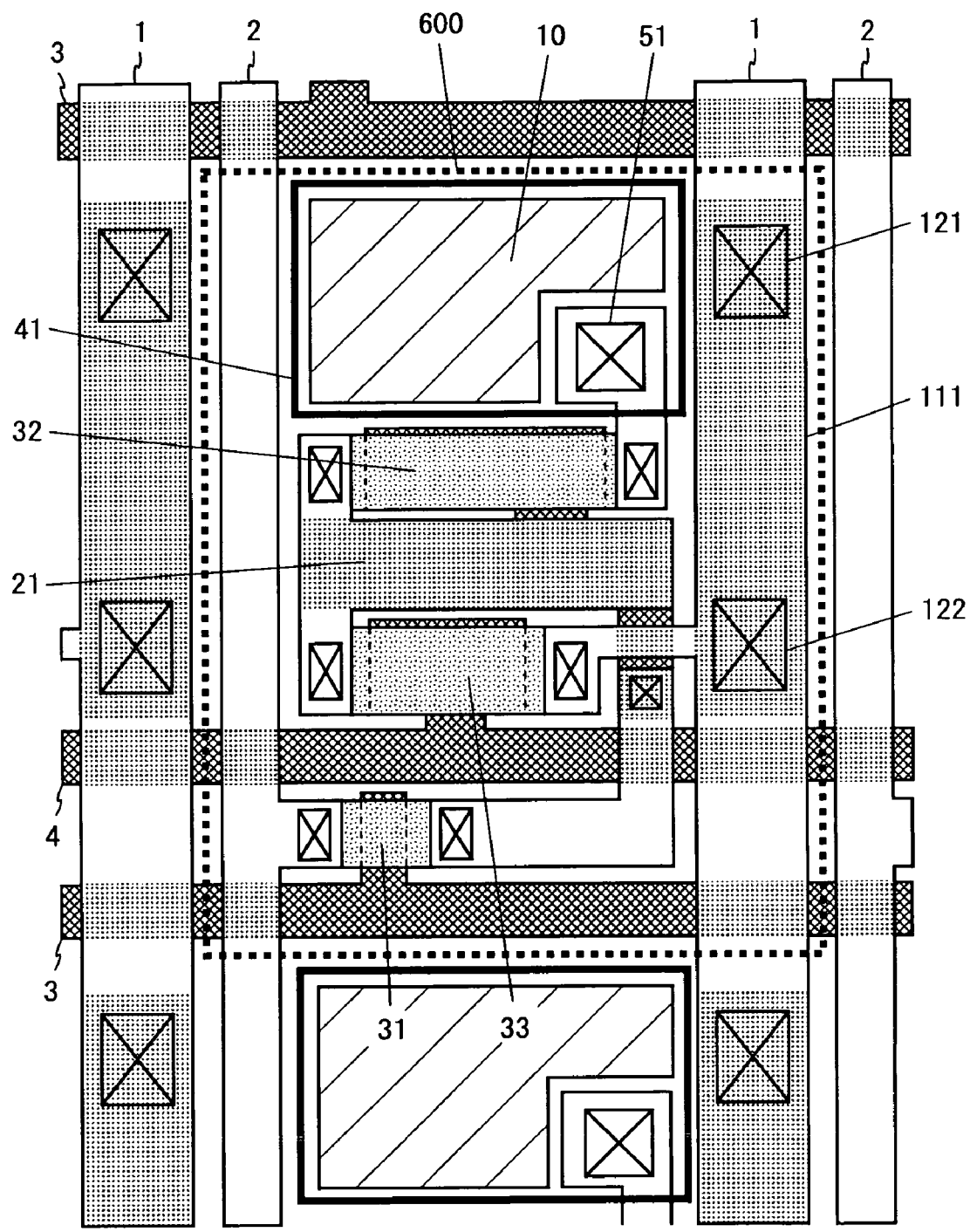
FIG. 9 is a plan view of a pixel in an EL display device according to a sixth embodiment of the present invention.

FIG. 9 is a plan view of a pixel in the EL display device according to the sixth embodiment of the present invention. A pixel 600 shown in FIG. 9 is provided with a plurality of control lines 4, in addition to the power source lines 1, the data lines 2 and the scanning lines 3. Further, the pixel 600 is provided with a pixel circuit including the EL element 10, the capacitor 21, the first TFT 31, the second TFT 32, a third TFT 33 and the transparent electrode 41. The control lines 4 are arranged together with the scanning lines 3 in parallel with one another on the first wiring layer. An extending direction of the control line 4 corresponds to a horizontal direction in FIG. 9.

Figure 10:
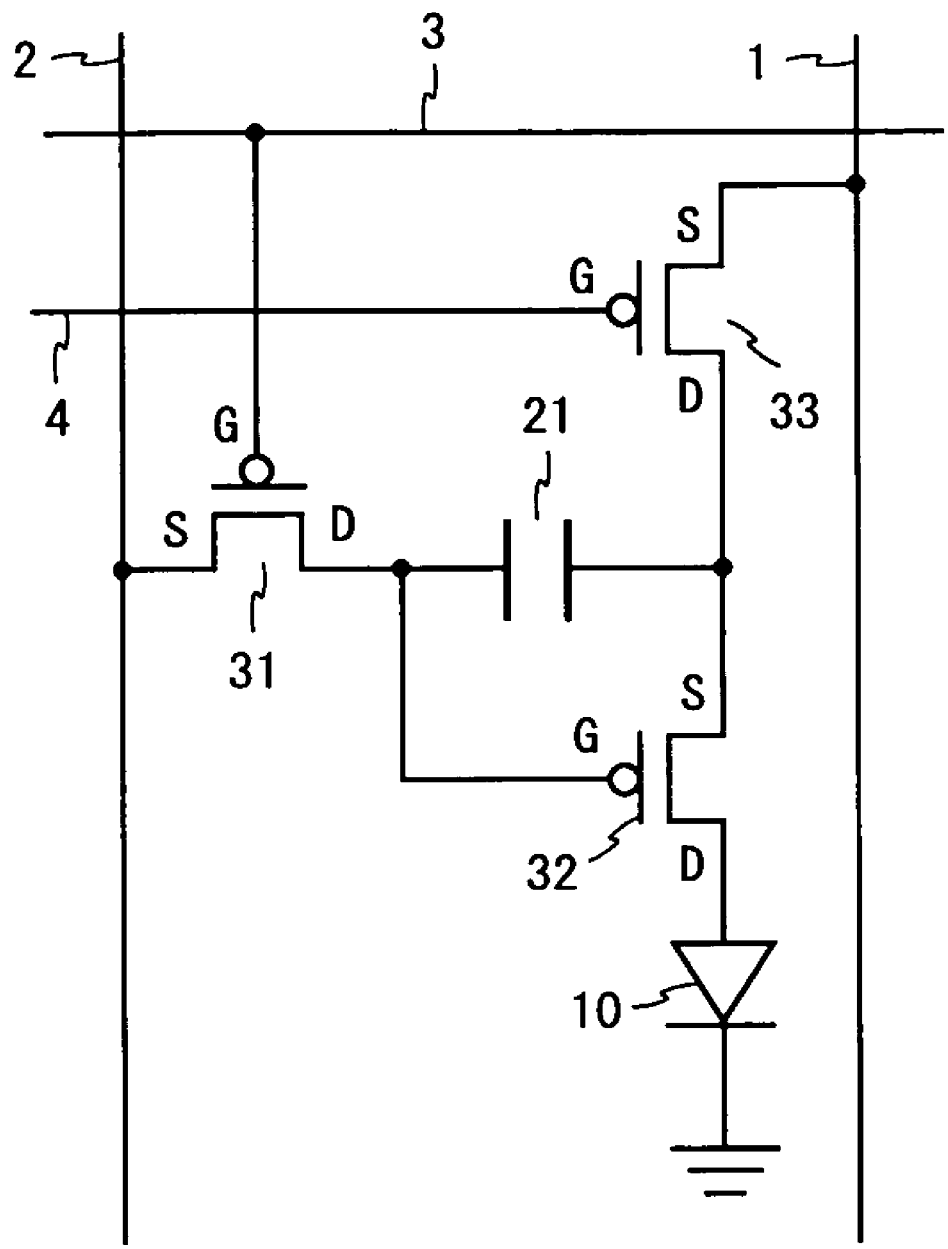
FIG. 10 is a circuit diagram of an equivalent circuit of the pixel shown in FIG. 9.
Figure 11:
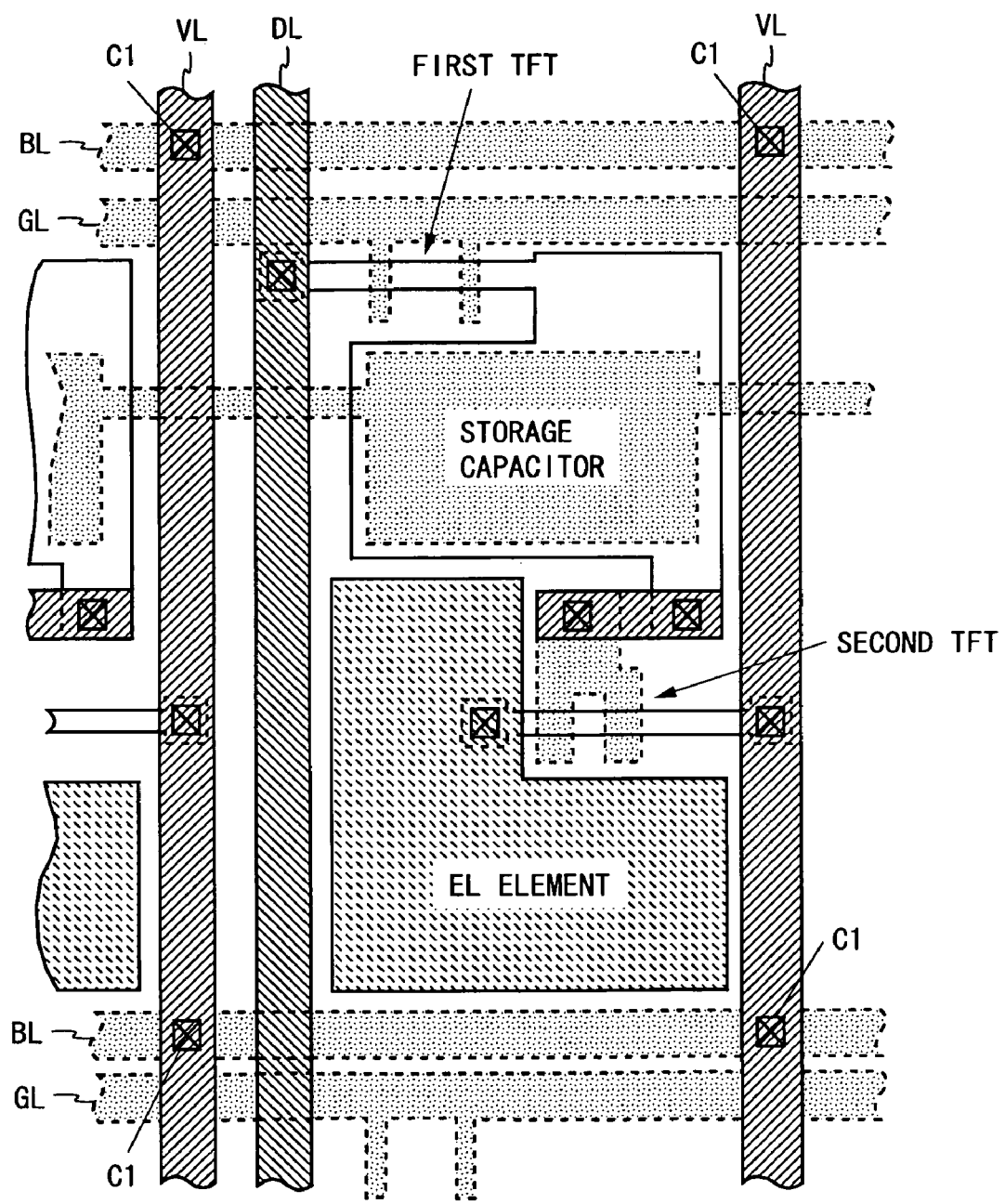
FIG. 11 is a plan view of a pixel in a conventional EL display device (a first example).
Figure 12:
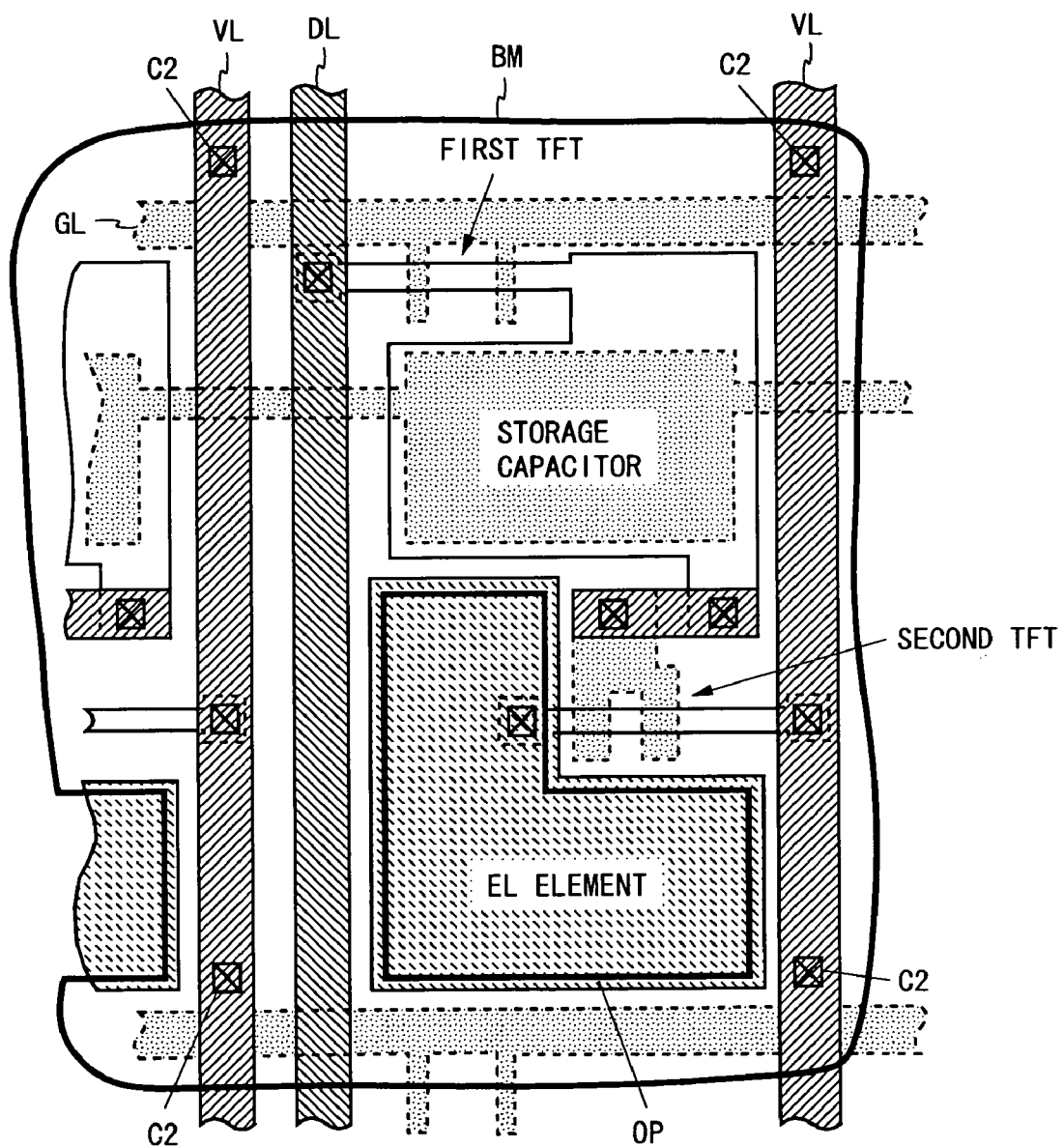
FIG. 12 is a plan view of a pixel in a conventional EL display device (a second example).

FIG. 10 is a circuit diagram of an equivalent circuit of the pixel 600. The circuit shown in FIG. 10 newly includes the third TFT 33 of a P-channel type, in addition to the constituent elements of the circuit shown in FIG. 2. The third TFT 33 has a source terminal connected to the power source line 1, a drain terminal connected to the source terminal of the second TFT 32, and a gate terminal connected to the control line 4. As described above, the third TFT 33 functions as a control TFT which is provided between the second TFT 32 serving as the drive TFT and the power source line 1 and determines whether or not an electric current is fed into the EL element 10 in accordance with a potential at the control line 4.

In the pixel 600, the bypass line 111 is arranged on at least a part of a portion obtained by removing the planar position of the scanning line 3 and the control line 4 from the planar position of the power source line 1 in the first wiring layer (the wiring layer on which the scanning line 3 is also arranged). In other words, the bypass line 111 electrically connected to the power source line 1 is arranged at the planar position of the power source line 1 in the wiring layer, on which the scanning line 3 is also arranged, so as not to intersect the scanning line 3 and the control line 4.

As in the case of the first embodiment, accordingly, the EL display device according to the sixth embodiment can decrease the resistance of the power source line 1 without incurring increase in cost and reduction in aperture ratio, and suppress the unevenness in brightness at the display screen.

It is to be noted that an appropriate combination of the features of the first to sixth embodiments allows realization of various modifications. For example, a bypass line which is wider in width than the power source line may be provided with one contact which is almost equal in length thereto. Alternatively, a bypass line which is wider in width than the scanning line may be provided on the scanning line. With regard to the circuit shown in FIG. 10, in addition, the plurality of contacts may be provided on the almost entire part of the bypass line.

In the foregoing description, the EL display device is of a bottom emission type. However, a top emission-type EL display device can also bring about advantages similar to those of the bottom emission-type EL display device, by providing a bypass line similar to that of the bottom emission-type EL display device. In the top emission-type EL display device, a back electrode must be transparent, but a substrate is not necessarily transparent. In the foregoing description, moreover, the TFT included in the pixel circuit is of a P-channel type; however, all of or a part of the TFTs included in the pixel circuits may be of an N-channel type.

Moreover, the power source line and the signal lines other than the power source line (the data line, the scanning line and the control line) may be provided on either the upper or lower wiring layer. In the foregoing description, further, the power source line and the scanning line (and the control line) are orthogonal to each other. Alternatively, the power source line may be orthogonal to the data line or another signal line. In such an EL display device, preferably, the bypass line is arranged on a portion obtained by removing a planar position of a signal line orthogonal to the power source line from the planar position of the power source line in the wiring layer on which the signal line orthogonal to the power source line is also arranged. In a case where two or more types of signal lines are orthogonal to the power source line, preferably, the bypass line is arranged on a portion obtained by removing the planar position of each signal line from the planar position of the power source line.

INDUSTRIAL APPLICABILITY

The EL display device according to the present invention brings about advantages that the resistance of the power source line is decreased and the unevenness in brightness at the display screen is suppressed and, therefore, can be utilized as a display device singly or a display section for various electronic appliances.

The invention claimed is:

1. An active matrix-type EL display device comprising:
a plurality of power source lines arranged in parallel with one another on a predetermined wiring layer;
a plurality of signal lines arranged in parallel with one another on a wiring layer, which is different from the wiring layer on which the power source lines are arranged, so as to be orthogonal to the power source lines;
a plurality of pixel circuits each including an EL element and one or more thin-film transistors, the plurality of pixel circuits being arranged side by side in an extending direction of the power source line and an extending direction of the signal line;
a bypass line arranged on at least a part of a portion obtained by removing a planar position of the signal line from a planar position of the power source line in the wiring layer on which the signal lines are also arranged; and a contact establishing electric connection between the power source line and the bypass line.

2. The EL display device according to claim 1, wherein the signal line is a scanning line.

3. The EL display device according to claim 1, wherein the bypass line is electrically connected to the power source line through two contacts provided at two ends thereof.

4. The EL display device according to claim 1, wherein the bypass line is electrically connected to the power source line through one contact which is almost equal in length thereto.

5. The EL display device according to claim 1, wherein the bypass line is electrically connected to the power source line through a plurality of contacts provided on an almost entire part thereof.

6. The EL display device according to claim 1, wherein the bypass line has a width which is almost equal to a width of the power source line.

7. The EL display device according to claim 1, wherein the bypass line has a width of which at least a part is wider than a width of the power source line.

8. The EL display device according to claim 1, further comprising:
  a signal bypass line arranged on at least a part of a portion obtained by removing the planar position of the power source line from the planar position of the signal line in the wiring layer on which the power source lines are also arranged; and
  a signal contact establishing electric connection between the signal line and the signal bypass line.

9. The EL display device according to claim 1, wherein the pixel circuit includes the EL element, and a drive thin-film transistor provided between the EL element and the power source line to control an amount of electric current to be fed into the EL element.

10. The EL display device according to claim 9, wherein the pixel circuit further includes a control thin-film transistor provided between the drive thin-film transistor and the power source line to determine whether or not the electric current is fed into the EL element.

* * * * *